April 29, 1969 E. S. DE BUCS ET AL 3,441,812
FUSED JUNCTION BETWEEN A GERMANIUM-SILICON SEMICONDUCTOR MEMBER AND A JUNCTION ELEMENT AND METHOD OF PRODUCING THE SAME
Filed Dec. 7, 1966
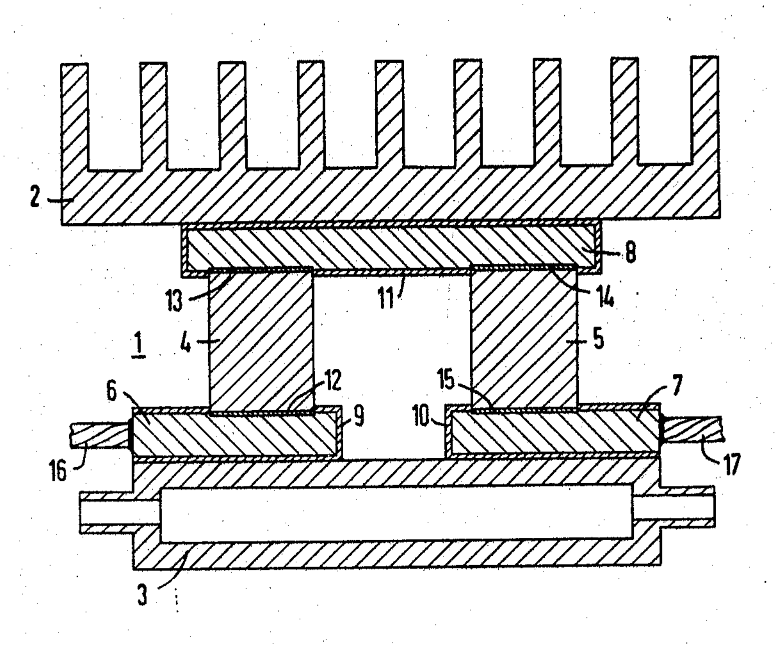

United States Patent Office 3,441,812
Patented Apr. 29, 1969

3,441,812

FUSED JUNCTION BETWEEN A GERMANIUM-SILICON SEMICONDUCTOR MEMBER AND A JUNCTION ELEMENT AND METHOD OF PRODUCING THE SAME

Eugen Szabo de Bucs, Erlangen, and Gerhard Oesterhelt and Doris Pietsch, Nuremberg, Germany, assignors to Siemens Aktiengesellschaft, a corporation of Germany Filed Dec. 7, 1966, Ser. No. 599,934
Claims priority, application Germany, Dec. 11, 1965, S 100,912
Int. Cl. H01l 3/12, 1/12
U.S. Cl. 317—234 7 Claims

ABSTRACT OF THE DISCLOSURE

Electrical junction between a germanium-silicon semiconductor member and a junction element, especially for thermoelectric generators, wherein the junction element consists of titanium disilicide or a silicon-enriched variant of this material and, except at the junction surface proper, the junction element is coated with a mixture of silicon oxides and titanium oxides. To produce the junction, the junction element is heated to a temperature as close as possible below the melting point thereof to form the oxides thereon which are fused to a glaze. After cooling, the junction surface proper of the junction element which is to engage the semiconductor member is freed of the glaze, and the semiconductor member is then fused to the glaze-free junction surface proper of the junction element.

Our invention relates to an electrical junction between a germanium-silicon semiconductor member and a junction element, more particularly a junction for thermoelectric generators such as of the type forming Peltier blocks as disclosed in Patent No. 3,111,813 of W. Blumentritt. The junction element of such a junction serves as connector element for an electrical conductor or lead thereto or as part of a contact bridge for thermocouple elements. The junction element must have substantially the same coefficient of expansion as the material of the semiconductor member so that no excessively large mechanical stresses should arise when temperature changes occur at the junction. Furthermore, the junction element must be resistant to corrosive atmosphere, and in many cases the junction element should be electrically insulated so that it is able to be pressed against a metallic heat exchange member for cooling purposes, for example.

It is accordingly an object of our invention to provide an electrical junction of the aforementioned type which meets all of the foregoing requirements. More particularly, it is an object of our invention to provide an electrical junction having the same coefficient of expansion as the semiconductor material which is joined, which is resistant to corrosive atmospheres and is, preferably, electrically insulated.

With the foregoing and other objects in view, we provide in accordance with our invention an electrical junction wherein the material employed for the junction element consists of titanium disilicide or a silicon-enriched variant of this material, and the junction element is provided with a coating formed of a mixture of silicon oxides and titanium oxides except at the junction surface proper.

Further in accordance with our invention, the oxide mixtures of silicon and titanium are obtainable by heating the aforementioned junction element materials. If, for example, titanium disilicide is heated in an oxygen-bearing atmosphere, for example air, to a temperature which is as close as possible below the melting point of the material for the junction elements, then oxides, and more particularly silicon oxides in which titanum oxides are dissolved, are formed at the surface of the junction element.

In accordance with a further feature of our invention, a layer or net of tungsten or molybdenum is provided between the semiconductor member and the junction element. Thus, when fusing the semiconductor member to the junction elements, the flow or spread of semiconductor material relative to the junction element is obstructed. Moreover, by such construction, an even better adjustment of the coefficients of expansion between the semiconductor member and the junction element is achieved.

Other features which are considered as characteristic for the invention are set forth in the appended claims.

Although the invention is illustrated and described herein as electrical junction between a germanium-silicon semiconductor member and a junction element, it is nevertheless not intended to be limited to the details shown, since various modifications and structural changes may be made therein without departing from the spirit of the invention and within the scope and range of equivalents of the claims.

The structure of the junction and the method of constructing the same, however, together with additional objects and advantages thereof, will be best understood from the following description when read in connection with the accompanying single figure of the drawing showing the junction between a junction element and a semiconductor member in cross-sectional view.

In the figure, there is shown a thermoelectric generator 1 provided with a heat exchanger 2 for a gaseous medium at the hot junction of the generator, and a heat exchanger 3 for a liquid medium at the cold junction of the generator. The thermoelectric generator includes two leg members 4 and 5 consisting of germanium-silicon semiconductor material, one of which is made p-conductive by doping with boron, gallium or indium, for example, while the other leg is rendered n-conductive by being doped with phosphorus, arsenic or antimony, for example. The junction elements 6, 7 and 8 of the thermoelectric generator of which the element 8 is constructed in the form of a bridge, consist of titanium disilicide. Except at the junction surfaces proper, the junction elements 6, 7 and 8 are provided with a coating 9, 10 and 11, respectively, of a mixture of oxides. The layers 12, 13, 14, 15 located between the semiconductor members and the junction elements are formed of tungsten. The junction elements 6 and 7 are suitably connected to electrical leads 16 and 17 in a conventional manner.

By means of the electrically insulating coating of oxide mixtures, electrical connection can be made independent of the heat flow path for a thermoelectric battery or Peltier block made up of several of the thermoelectric generator units shown in the figure. For example, the legs 4, 5 of the thermogenerators can be connected electrically in series and thermally in parallel.

The junction formed in accordance with our invention not only meets the requirements mentioned hereinbefore but also possesses in addition considerably advantageous characteristics. Since the junction element is formed with a component substance which is the same as the material of the semiconductor member, the semiconductor member is then directly alloyable or fusible immediately after removal of the oxide layer at the junction locations, without requiring additional solder, which might otherwise affect the electrical characteristics of the semiconductor in an undesirable manner. The junction element coated with the oxide layer possesses a very high thermal stability and great durability with regard to temperature variation, great hardness or toughness and high ultimate strength. Consequently, the junction of our invention is particularly suitable for thermoelectric generators.

Experiments have found that the junction locations can be readily subjected to more than 1000° C. so that for thermoelectric generators, better efficiency is possible with the junction materials of our invention than with the heretofore known junction materials..

The junction produced in accordance with our invention was effected, as an example, as follows: The suitably preformed junction elements of titanium disilicide or silicon-enriched variants of these materials were heated to a temperature which lies as close as possible beneath the fusion temperature of the titanium disilicide or the respective variants, as the case was. Oxides, i.e., silicon oxides and titanium oxides, consequently formed on the surface of the element and fused to a glaze thereon. After being cooled, the surfaces which were to be contact-bonded or joined were mechanically freed of the glaze. The semiconductor legs 4 and 5 were then fused onto the surface locations which were freed of the glaze. Intermediate layers 12 to 15 were obtained when a foil or net of molybdenum or tungsten was disposed between the legs 4, 5 of the semiconductor member, on the one hand, and the respective junction elements 6, 7, 8, on the other hand, before the semiconductor legs were heated to the melting point thereof.

We claim:

1. A semiconductor structure comprising a germanium-silicon semiconductor member and a junction element fused to said semiconductor member, said junction element being formed of a material selected from the group consisting of titanium disilicide and silicon-enriched titanium disilicide thereof, said juncton element, except at the junction engaged with the semiconductor member, having a surface coating consisting of a mixture of silicon oxides and titanium oxides.

2. Structure according to claim 1, wherein said semiconductor member is a thermoelectrically active leg of a thermoelectric generator.

3. Structure according to claim 1 including a layer of material selected from the group consisting of molybdenum and tungsten interposed between the semiconductor member and said junction element.

4. Structure according to claim 3 wherein said layer is in the form of a net.

5. Method of producing a structure of a germanium-silicon semiconductor member fused to a junction element, comprising heating a junction element consisting of a material selected from the group consisting of titanium disilicide and silicon-enriched titanium disilicide to a temperature immediately below the melting point of the material to form a glaze of silicon and titanium oxides on the surface thereof, cooling the junction element, removing the glaze from a junction surface portion of the junction element engageable with the semiconductor member, and fusing the semiconductor member to the junction element at the junction surface portion.

6. Method according to claim 5 further comprising interposing a layer of material selected from the group consisting of molybdenum and tungsten between the semiconductor member and the junction surface portion of the junction element prior to fusing the semiconductor member to the junction element.

7. Method according to claim 6 wherein the layer of material is in the form of a net.

References Cited

UNITED STATES PATENTS

| | | | |
|---|---|---|---|
| 2,777,975 | 1/1957 | Aigrain | 317—234 |
| 2,898,743 | 8/1959 | Bradley | 62—3 |
| 2,952,786 | 9/1960 | Lewis | 310—8.9 |
| 2,994,203 | 8/1961 | Lackey et al. | 62—3 |
| 3,127,287 | 3/1964 | Henderson et al. | 136—4 |

JAMES D. KALLAM, *Primary Examiner.*

U.S. Cl. X.R.

317—243